(12) United States Patent
Lin

(10) Patent No.: US 7,816,698 B2
(45) Date of Patent: Oct. 19, 2010

(54) HEAT DISSIPATION PACKAGE FOR HEAT GENERATION ELEMENT

(75) Inventor: Ming-Te Lin, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 306 days.

(21) Appl. No.: 11/936,090

(22) Filed: Nov. 7, 2007

(65) Prior Publication Data

US 2008/0251805 A1 Oct. 16, 2008

(30) Foreign Application Priority Data

Apr. 13, 2007 (TW) .............................. 096112989 A

(51) Int. Cl.
*H01L 33/00* (2010.01)
(52) U.S. Cl. .................... 257/98; 257/99; 257/675; 257/693; 257/712; 257/713; 257/E33.056; 257/E33.075; 257/E23.083; 257/E23.102; 257/E23.104
(58) Field of Classification Search .................. 257/98, 257/99, 693, 712, 713, E33.056, E33.075, 257/E23.083, E23.102, E23.104
See application file for complete search history.

(56) References Cited

U.S. PATENT DOCUMENTS

| 4,862,246 A * | 8/1989 | Masuda et al. ............... 257/666 |
| 5,828,172 A * | 10/1998 | Berthold et al. .............. 313/512 |
| 2002/0113244 A1 * | 8/2002 | Barnett et al. .................. 257/98 |
| 2002/0117740 A1 * | 8/2002 | Jang et al. ..................... 257/677 |
| 2006/0102917 A1 * | 5/2006 | Oyama et al. .................. 257/99 |
| 2006/0103012 A1 * | 5/2006 | Chin .......................... 257/712 |
| 2006/0131591 A1 * | 6/2006 | Sumitani ..................... 257/79 |
| 2006/0219008 A1 * | 10/2006 | Tanaka et al. ............. 73/504.16 |
| 2008/0220547 A1 * | 9/2008 | Chan et al. .................... 438/22 |

FOREIGN PATENT DOCUMENTS

CN 2517112 10/2002

OTHER PUBLICATIONS

"1st Office Action of China counterpart application", issued on Jul. 17, 2009, p. 1-p. 6.

* cited by examiner

*Primary Examiner*—Tu-Tu V Ho
(74) *Attorney, Agent, or Firm*—Jianq Chyun IP Office

(57) ABSTRACT

A heat dissipation package is provided. Conducting leads of the package are located between two dissipating parts of a heat dissipation carrier to form the heat dissipation package with a structure of heat outside and electricity inside. Consequently, there is no limitation caused by electrical elements surrounding the heat dissipation carrier, so as to enhance the expandability of the heat dissipation carrier and improve the efficiency for heat dissipation of the heat generation element.

24 Claims, 18 Drawing Sheets

HEAT DISSIPATION PACKAGE FOR HEAT GENERATION ELEMENT

CROSS-REFERENCE TO RELATED APPLICATION

This application claims the priority benefit of Taiwan application serial no. 96112989, filed on Apr. 13, 2007. All disclosure of the Taiwan application is incorporated herein by reference.

BACKGROUND OF THE INVENTION

1. Field of the Invention

This invention relates to a heat dissipation package including an electronic device such as a light emitting diode (LED), a laser diode, an integrated circuit chip, a semiconductor chip, and so on.

2. Description of Related Art

FIG. 1A is a perspective view of a conventional package mechanism characterized by a structure of "heat inside and electricity outside" according to the related art, while FIG. 1B is a sectional view of the conventional package mechanism characterized by the structure of "heat inside and electricity outside" according to the related art. Here, an LED 3 is mounted in a cup 222 in a heat dissipation base 2. A metal lead 1 having two branches and serving as a first electrode lead of the LED 3 extends from one side of the heat dissipation base 2 and straddles thereunder. Another metal lead 11 having another two branches and serving as a second electrode lead of the LED 3 is bonded to another side of the heat dissipation base 2. The package mechanism indicates that the metal leads 1 and 11 are distributed at peripheries of a light emitting unit, and the heat dissipation base 2 is located between the metal leads 1 and 11. Due to a restriction arisen from the metal leads 1 and 11 surrounding the heat dissipation base 2, it is unlikely for the heat dissipation base 2 to be expanded outward, such that the heat dissipation capacity thereof cannot be significantly enhanced. An encapsulating material 5 packages and protects the LED 3 and a wire 4, and a top of the metal lead 11 and the heat dissipation base 2 are aligned together through the encapsulating material 5. Since the encapsulating material 5 encapsulates most areas at the top of the heat dissipation base 2, the effective heat dissipation area is reduced to a great extent.

SUMMARY OF THE INVENTION

The present invention discloses a heat dissipation package having a structure of "heat outside and electricity inside", and thus the heat dissipation package is capable of improving the efficiency for heat dissipation of a heat generation element.

The heat dissipation package for the heat generation element in the present invention includes a heat generation element, a heat dissipation carrier and conducting leads. The heat generation element has two electrodes. The heat dissipation carrier has two dissipating parts and a carrier part. The carrier part connects the dissipating parts, and the heat generation element is disposed on the carrier part. The conducting leads are electrically coupled to the electrodes of the heat generation element, located between two dissipating parts of the heat dissipation carrier, and electrically insulated from the heat dissipation carrier, so as to form the package with a structure of "heat outside and electricity inside".

In the heat dissipation package for the heat generation element according to the present invention, there is no limitation caused by electric elements located around the heat dissipation carrier, so as to enhance the lateral and the two-dimensional expandability of the heat dissipation carrier. As such, more heat sinks can be installed based on different conditions, and the heat dissipation capacity can be effectively improved.

In order to achieve aforementioned and other objects, features and advantages of the present invention, embodiments accompanied with figures are described in detail below.

BRIEF DESCRIPTION OF THE DRAWINGS

FIG. 7A depicts the W-shaped heat dissipation carrier which is not yet wedged to a heat dissipation base, while

DESCRIPTION OF EMBODIMENTS

Figure 1A:
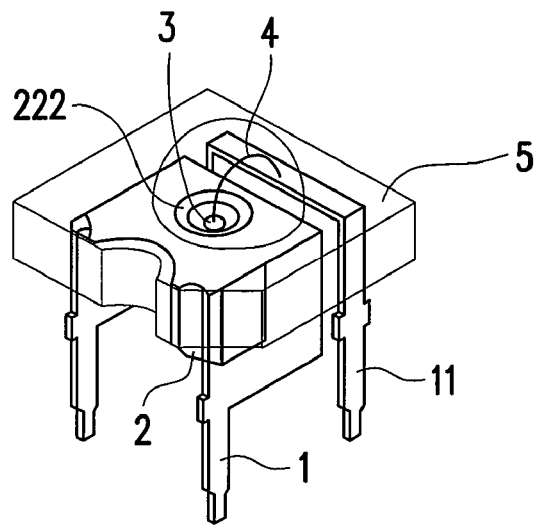
FIGS. 1A and 1B are a perspective view and a sectional view respectively illustrating a conventional package mechanism characterized by a structure of "heat inside and electricity outside".
Figure 1B:
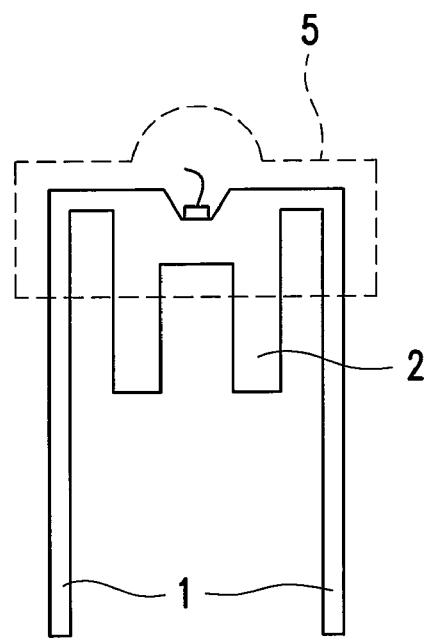
Figure 2A:
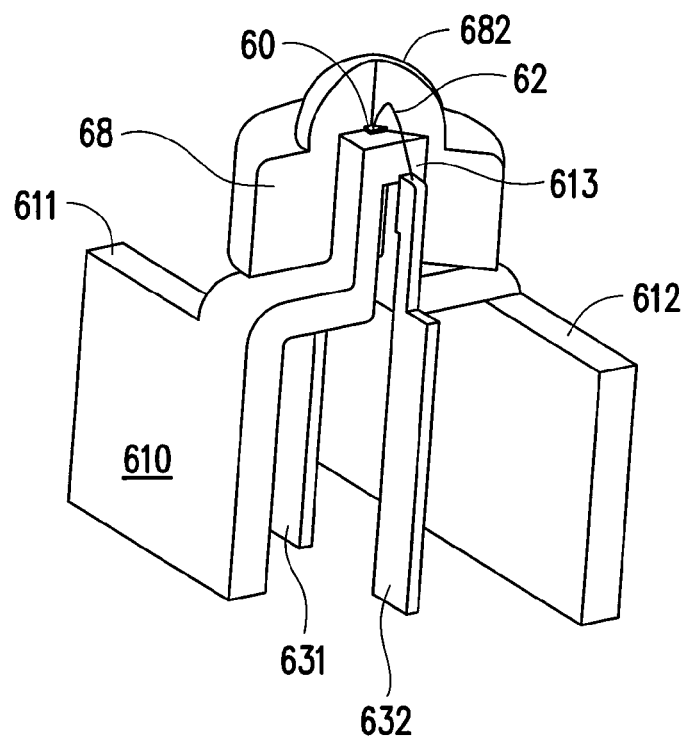
FIGS. 2A and 2B are a perspective view and a sectional view respectively illustrating an inverted U-shaped heat dissipation carrier in a heat dissipation package according to a first embodiment of the present invention.

FIG. 2A is a perspective view illustrating an inverted U-shaped heat dissipation carrier in a heat dissipation package according to a first embodiment of the present invention. According to FIG. 2A, the heat dissipation carrier 610 is divided into a carrier part 613, a left dissipating part 611 and a right dissipating part 612. An LED 60 is mounted on the carrier part 613. The underside of the carrier part 613 is connected to the left heat dissipation plate 611 and the right heat dissipation plate 612. Conducting leads 631 and 632 are located between the left dissipating part 611 and the right dissipating part 612, and the material of the conducting leads 631 and 632 may be metal or other appropriate conductive materials. Similarly, the material of the heat dissipation carrier 610 may also be metal or other appropriate heat-conductive materials. One top electrode of the LED 60 is electrically coupled to the conducting lead 632 through a wire 62. Another top electrode of the LED 60 is electrically coupled to the conducting lead 631 through another wire (not shown in the drawings). The heat dissipation carrier 610 and the conducting leads 631 and 632 are secured with the use of an encapsulating material 68, so as to maintain a predetermined arrangement of relative positions of the above mentioned components. A lens 682 is disposed at a light emitting end of the LED 60, so as to modify the light emitted therefrom and to protect the LED 60.

Figure 2B:
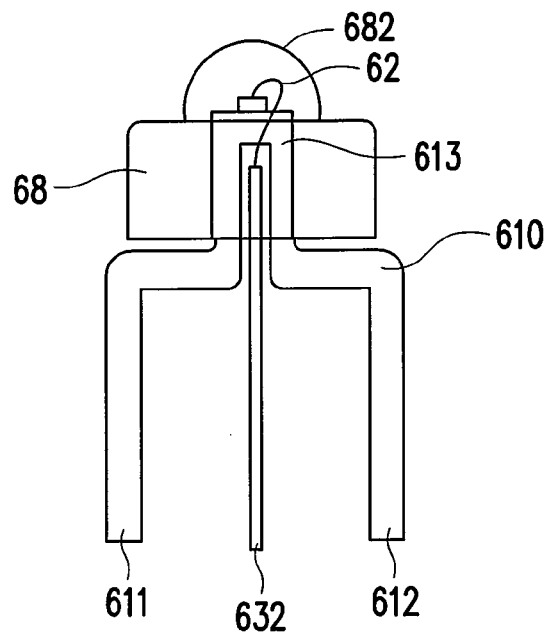

FIG. 2B is a sectional view illustrating the inverted U-shaped heat dissipation carrier in the heat dissipation package for the heat generation element according to the first embodiment of the present invention. According to FIG. 2B, the conducting lead 632 is located between the left dissipating part 611 and the right dissipating part 612. The conducting leads 631 and 632, the left dissipating part 611 and the right dissipating part 612 are all secured with the encapsulating material 68, so as to maintain the predetermined arrangement of the relative positions of these components. The encapsulating material 68 may be transparent.

Figure 2C:
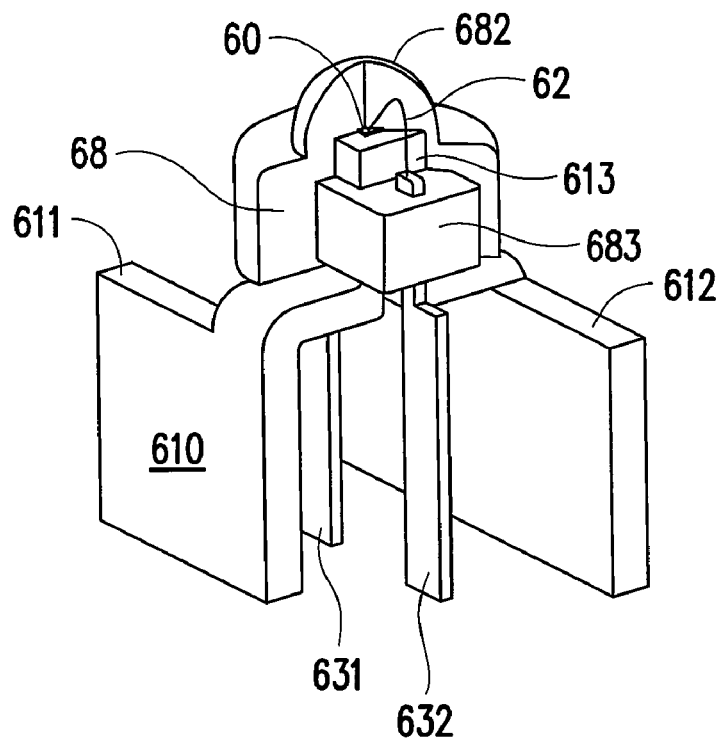
FIGS. 2C and 2D are a perspective view and a sectional view respectively illustrating a heat dissipation package with use of an enhanced encapsulating material according to a second embodiment of the present invention.

FIG. 2C is a perspective view illustrating a heat dissipation package with use of an enhanced encapsulating material according to a second embodiment of the present invention. An enhanced encapsulating material 683 secures the heat dissipation carrier 610 and the conducting leads 631 and 632. The enhanced encapsulating material 683 and the encapsulating material 68 are made of different materials, and the enhanced encapsulating material 683 is able to improve endurance for resisting deformation when the conducting leads 631 and 632, the left dissipating part 611 and the right dissipating part 612 are assembled. For example, the enhanced encapsulating material 683 could be made of plastic or other appropriate material, and the encapsulating material 68 could be made of silicon, epoxy resin or other appropriate material. The enhanced encapsulating material 683 may be transparent or opaque.

Figure 2D:
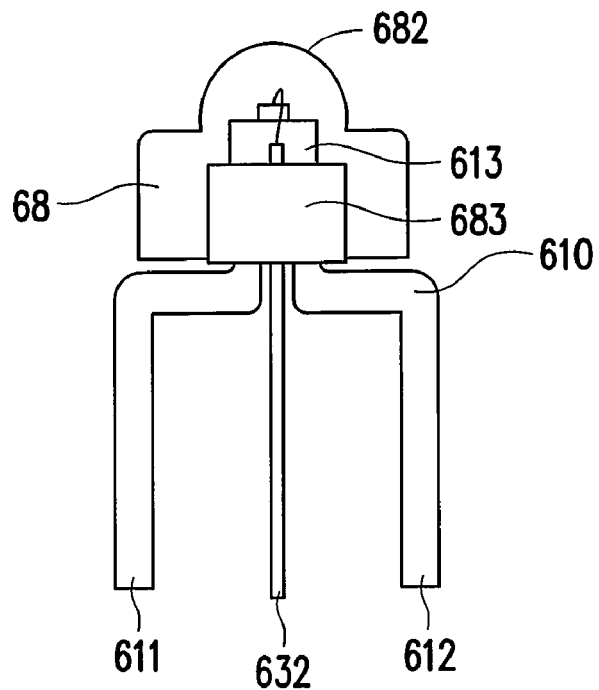

FIG. 2D is a sectional view illustrating the heat dissipation package for the heat generation element with use of the enhanced encapsulating material according to the second embodiment of the present invention. According to FIG. 2D, the enhanced encapsulating material 683 secures the conducting leads 631 and 632, the left dissipating part 611 and the right dissipating part 612, so as to maintain a specific arrangement of relative positions of these components.

Figure 3A:
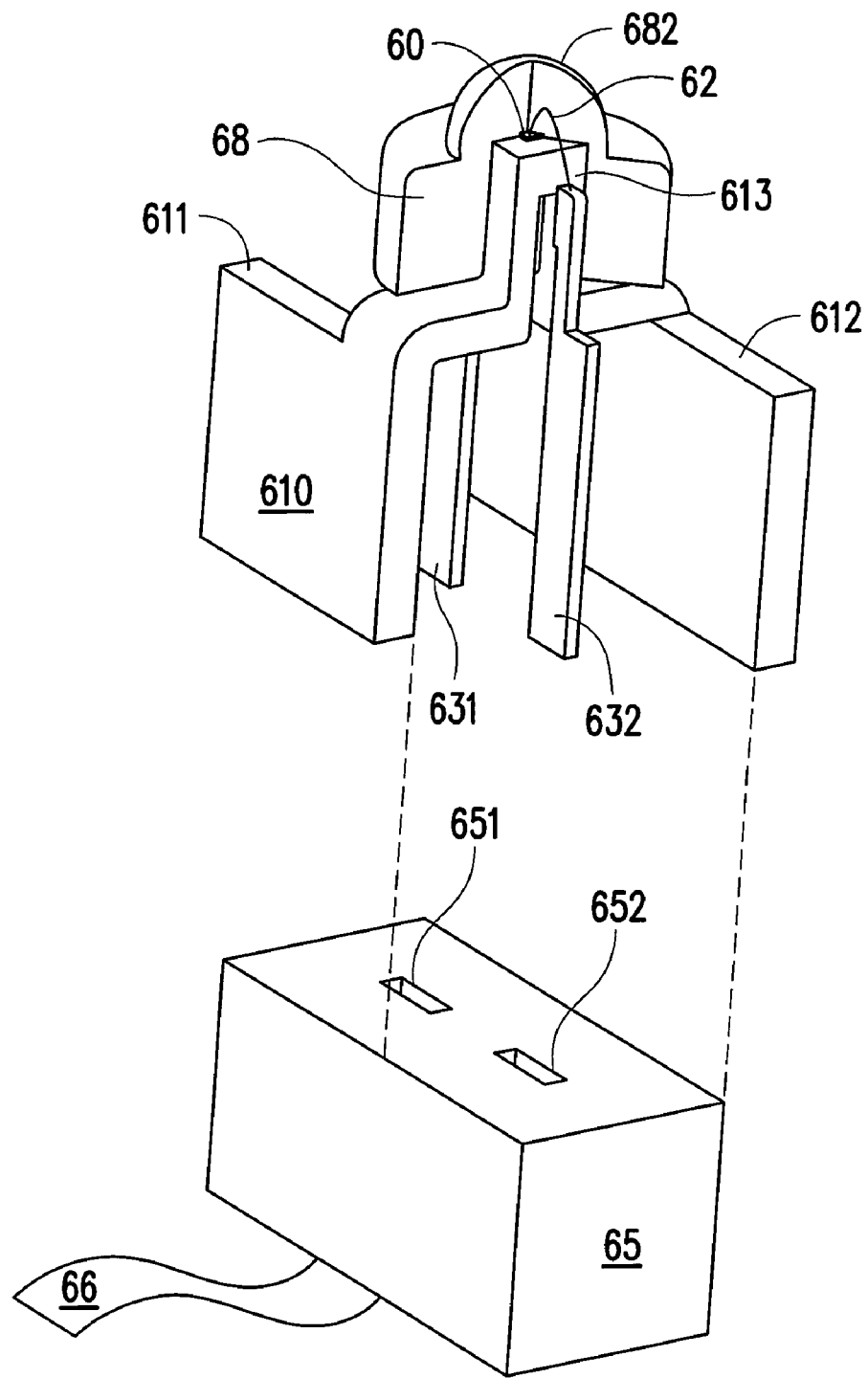
FIGS. 3A and 3B depict two plugs in a heat dissipation package according to the present invention, respectively.

FIG. 3A depicts a plug in a heat dissipation package according to the present invention. A plug 65 has a pair of plug holes 651 and 652 where the conducting leads 631 and 632 are wedged. In addition, the plug 65 is electrically coupled to one end of a power line 66. Another end of the power line 66 is electrically coupled to an external power supply (not shown in the drawings). The plug 65 is designed in compliance with a space between the left dissipating part 611 and the right dissipating part 612, such that the plug 65 can be wedged in the space therebetween.

Figure 3B:
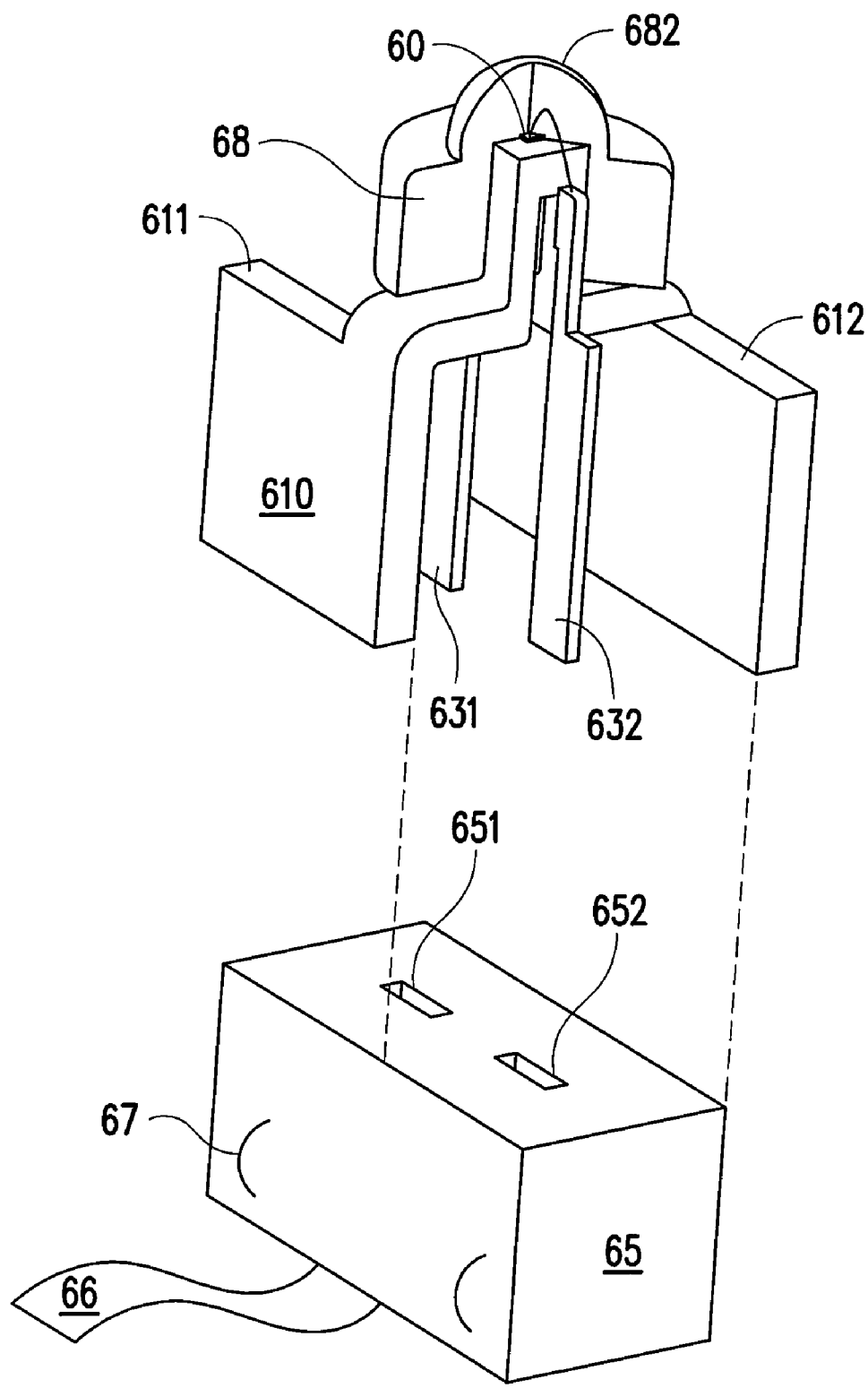

FIG. 3B depicts another design of the plug in the heat dissipation package for the heat generation element according to the present invention. Namely, at least a bump 67 is positioned to a side of the plug 65. Thereby, the plug 65 can be more tightly wedged into the space between the left dissipating part 611 and the right dissipating part 612. Moreover, the bump 67 may push outward against the left dissipating part 611 and the right dissipating part 612, so as to attach surfaces of the left dissipating part 611 and the right dissipating part 612 to a corresponding contact surface of an external heat dissipation base.

Figure 4:
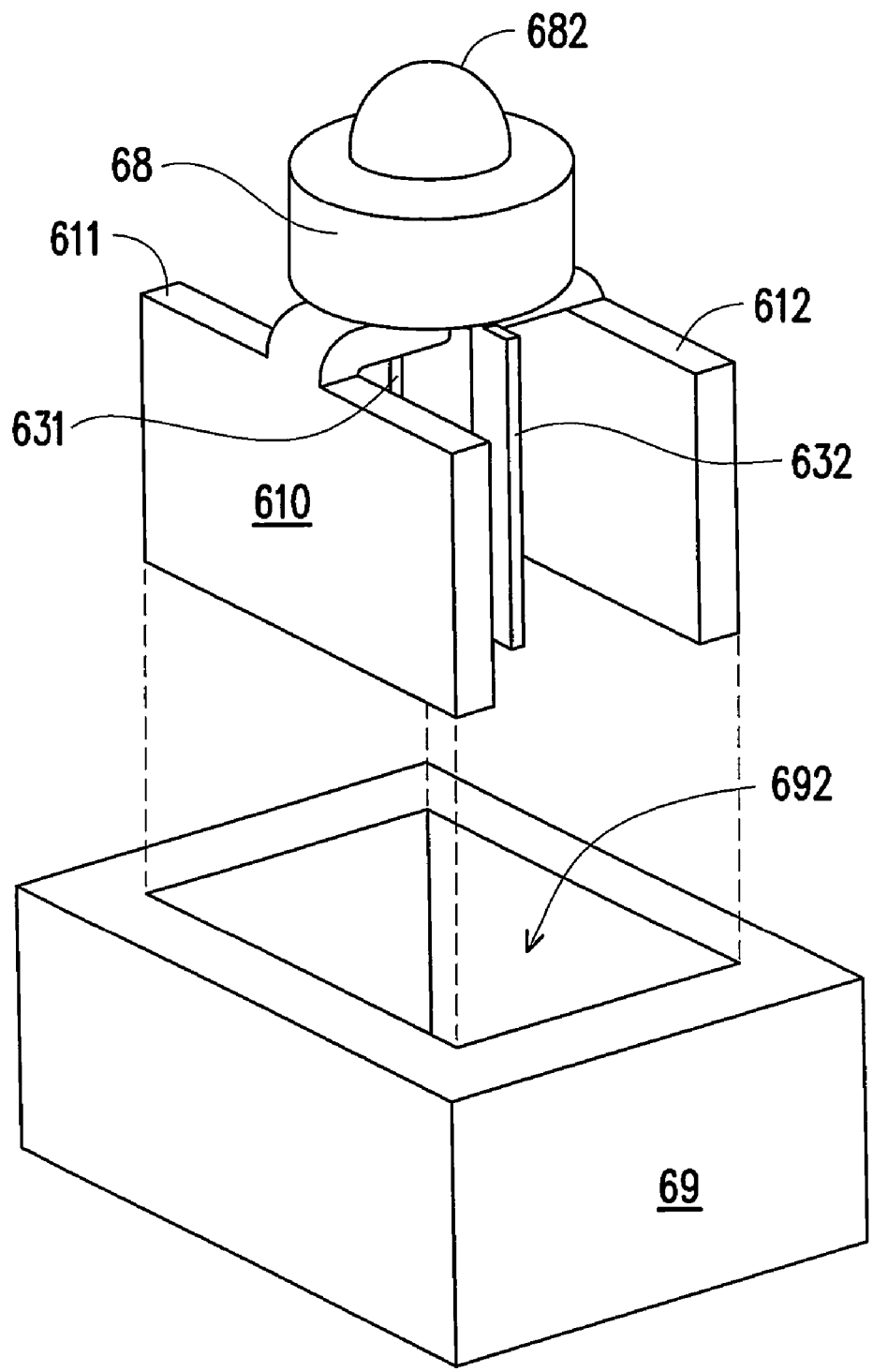
FIG. 4 depicts a heat dissipation package assembled by being inserted into a heat generation element according to the present invention.

FIG. 4 depicts a heat dissipation package assembled by being inserted into a heat generation element according to the present invention. Here, FIG. 4 is a schematic view depicting a heat dissipation base 69 without being inserted into the heat dissipation package for the heat generation element characterized by a structure of heat outside and electricity inside. The heat dissipation base 69 has a through hole 692 whose dimension is designed corresponding to the dimensions of the left dissipating part 611 and the right dissipating part 612, such that when the left dissipating part 611 and the right dissipating part 612 are wedged into the through hole 692, outside surfaces of the left dissipating part 611 and the right dissipating part 612 may be substantially in contact with inside surfaces of the through hole 692 of the heat dissipation base 69, facilitating an efficiency of transferring heat generated from the LED 60.

Figure 5A:
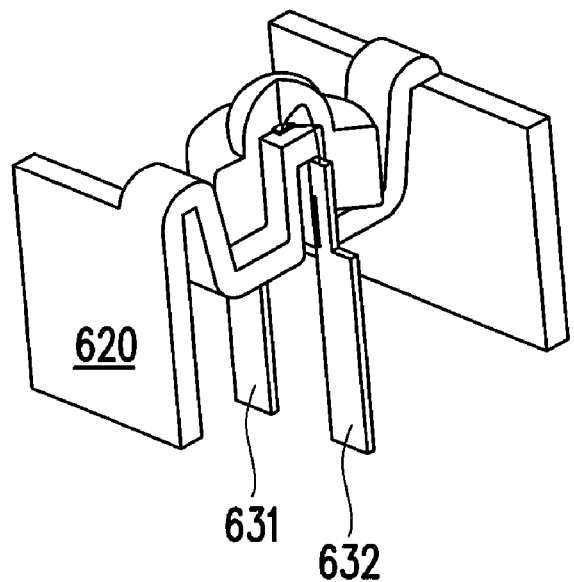
FIGS. 5A and 5B are a perspective view and a sectional view respectively illustrating an M-shaped heat dissipation carrier in a heat dissipation package according to a third embodiment of the present invention.

FIG. 5A is a perspective view illustrating an M-shaped heat dissipation carrier in a heat dissipation package according to a third embodiment of the present invention. According to the present embodiment, a section of the heat dissipation carrier 620 is shaped as a letter M for providing favorable spring function to the left dissipating part 611 and the right dissipating part 612. As the M-shaped heat dissipation carrier 620 is inserted into the heat dissipation base 69 as depicted in FIG. 4, an outward wedging force of the M-shaped heat dissipation carrier 620 ensures the tight contact of the left dissipating part 611 and the right dissipating part 612 to the inside surfaces of the through hole 692 of the heat dissipation base 69.

Figure 5B:
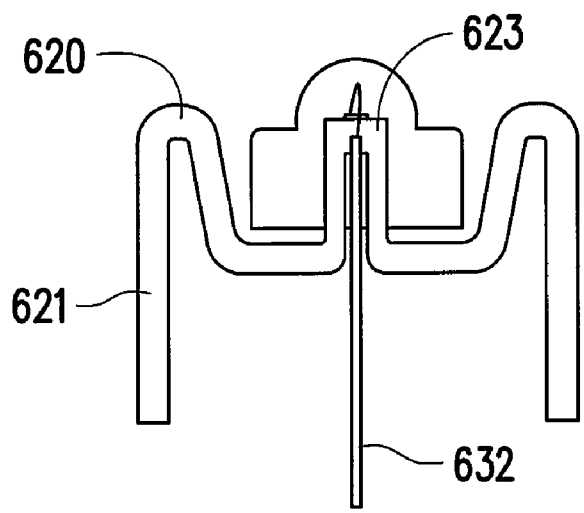

FIG. 5B is a sectional view illustrating the M-shaped heat dissipation carrier in the heat dissipation package for the heat generation element according to the third embodiment of the present invention. According to FIG. 5B, the M-shaped heat dissipation carrier 620 provides three angles between a left dissipating part 621 and a carrier part 623 positioned in the middle part of the M-shaped heat dissipation carrier 620. The left part and the right part of the M-shaped heat dissipation carrier 620 are symmetrical to each other, leading to an elastic buffering between the left part and the right part of the M-shaped heat dissipation carrier 620, as shown in FIG. 5B. As the M-shaped heat dissipation carrier 620 is wedged into the through hole 692 of the heat dissipation base 69, elasticity in the left and the right parts of the M-shaped heat dissipation carrier 620 is able to provide the wedging force.

Figure 6A:
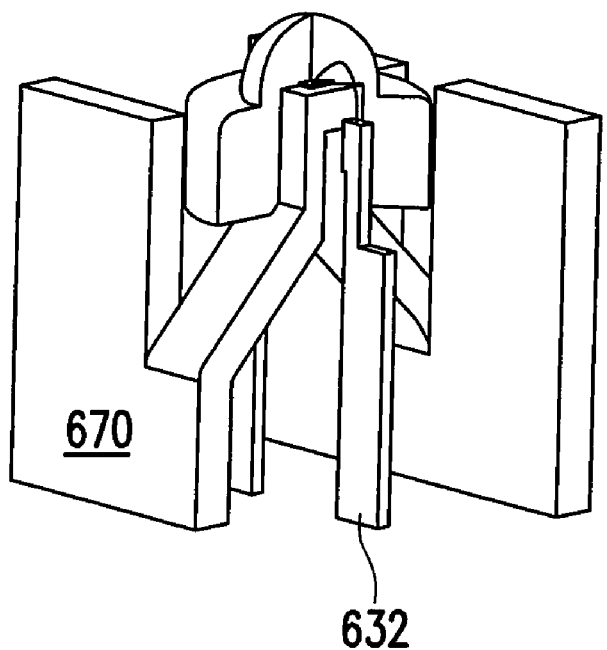
FIGS. 6A and 6B are a perspective view and a sectional view respectively illustrating a W-shaped heat dissipation carrier in a heat dissipation package according to a fourth embodiment of the present invention.

FIG. 6A is a perspective view illustrating a W-shaped heat dissipation carrier in a heat dissipation package according to a fourth embodiment of the present invention. The section of a heat dissipation carrier 670 is shaped as a letter W, and the heat dissipation carrier 670 achieves a similar effect to the M-shaped heat dissipation carrier provided in the previous embodiment.

Figure 6B:
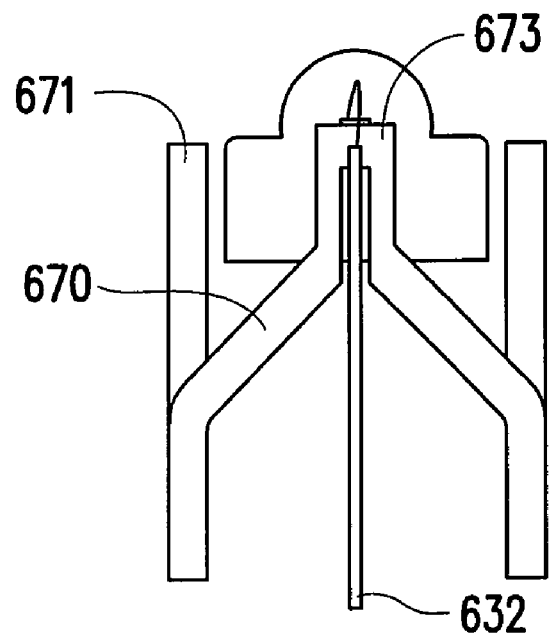

FIG. 6B is a sectional view illustrating the W-shaped heat dissipation carrier in the heat dissipation package for the heat generation element according to the fourth embodiment of the present invention. The W-shaped heat dissipation carrier 670 provides two angles between a left dissipating part 671 and a carrier part 673 in the middle part of the W-shaped heat dissipation carrier 670 for providing an elastic buffering. When the W-shaped heat dissipation carrier 670 is wedged into the through hole 692 of the heat dissipation base 69, as depicted in FIG. 4, elasticity in the left and the right parts of the W-shaped heat dissipation carrier 670 is able to provide the wedging force.

Figure 7A:
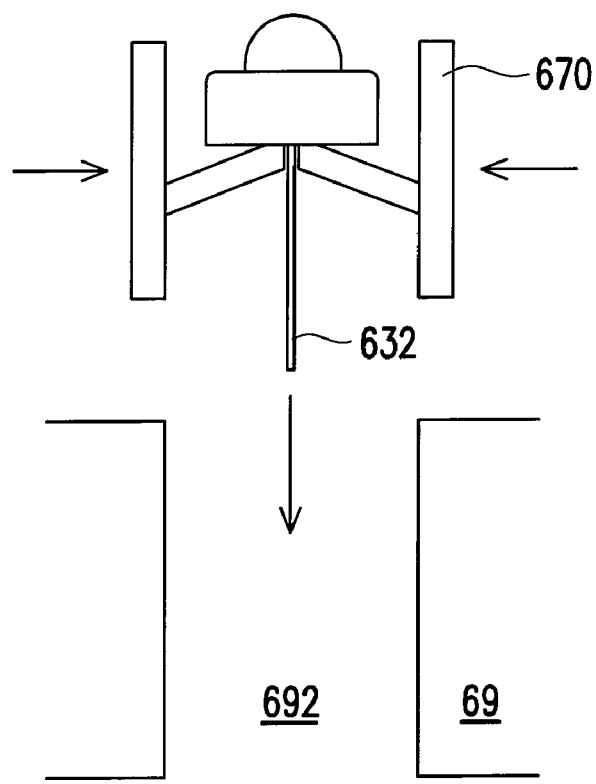
Figure 7B:
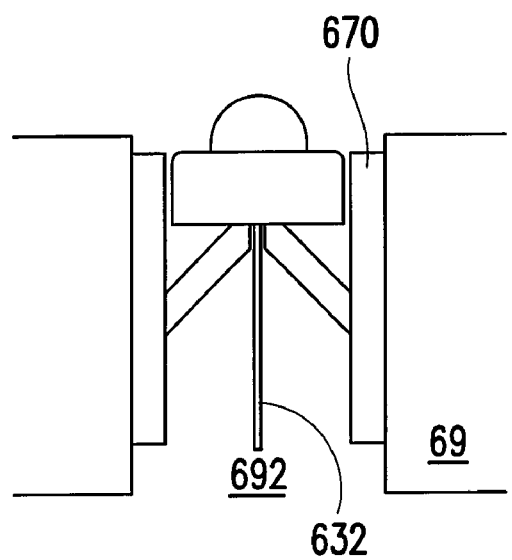
FIG. 7B illustrates the W-shaped heat dissipation carrier which is already wedged to the heat dissipation base.

FIG. 7A depicts a W-shaped heat dissipation carrier which is not yet wedged into a heat dissipation base, while FIG. 7B illustrates the W-shaped heat dissipation carrier which is already wedged into the heat dissipation base. In FIG. 7A, the W-shaped heat dissipation carrier 670 has not been wedged into the heat dissipation base 670 yet. The distance between the left and the right dissipating parts of the heat dissipation carrier 670 slightly exceeds a span of the through hole 692 of the heat dissipation base 69. In FIG. 7B, the W-shaped heat dissipation carrier 670 has already been wedged into the heat dissipation base 670. The left and the right dissipating parts of the heat dissipation carrier 670 are narrowed towards the middle part of the heat dissipation carrier 670, and the heat dissipation carrier 670 is then inserted into the through hole 692. The deformation occurring in a portion of the heat dissipation carrier 670 leads to the elasticity in the left and the right parts of the heat dissipation carrier 670. As such, the left side and the right side of the heat dissipation carrier 670 can be closely contacted to the inside surfaces of the through hole 692 of the heat dissipation base 69.

Figure 8:
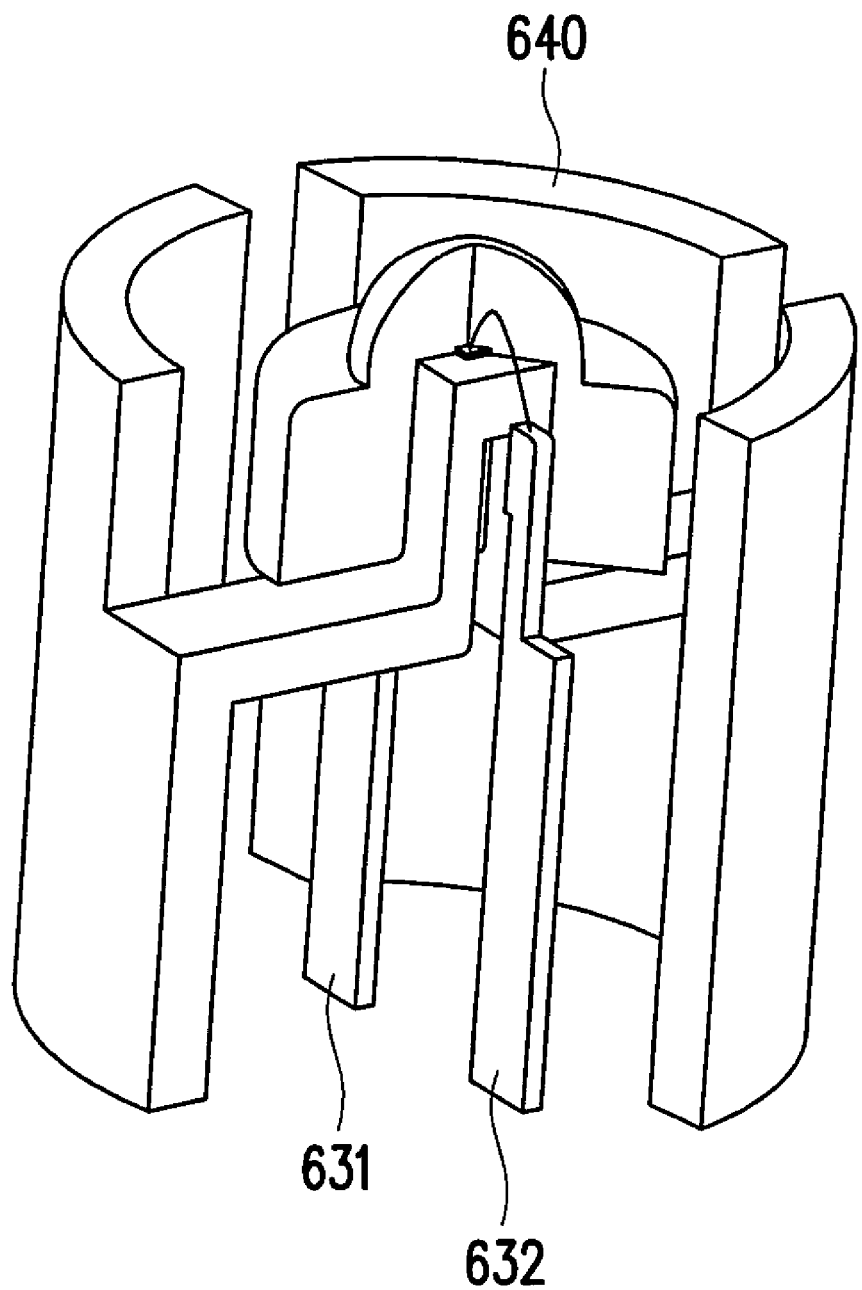
FIG. 8 is a perspective view illustrating an inverted U-shaped circular heat dissipation carrier in a heat dissipation package according to a fifth embodiment of the present invention.

FIG. 8 is a perspective view illustrating an inverted U-shape circular heat dissipation carrier in a heat dissipation package according to a fifth embodiment of the present invention. According to FIG. 8, since the heat dissipation carrier of the present invention may have a circular profile, the inverted U-shaped circular heat dissipation carrier 640 is constructed. Correspondingly, the through hole of the heat dissipation base should be made in a cylindrical form (not shown in the drawings).

Figure 9:
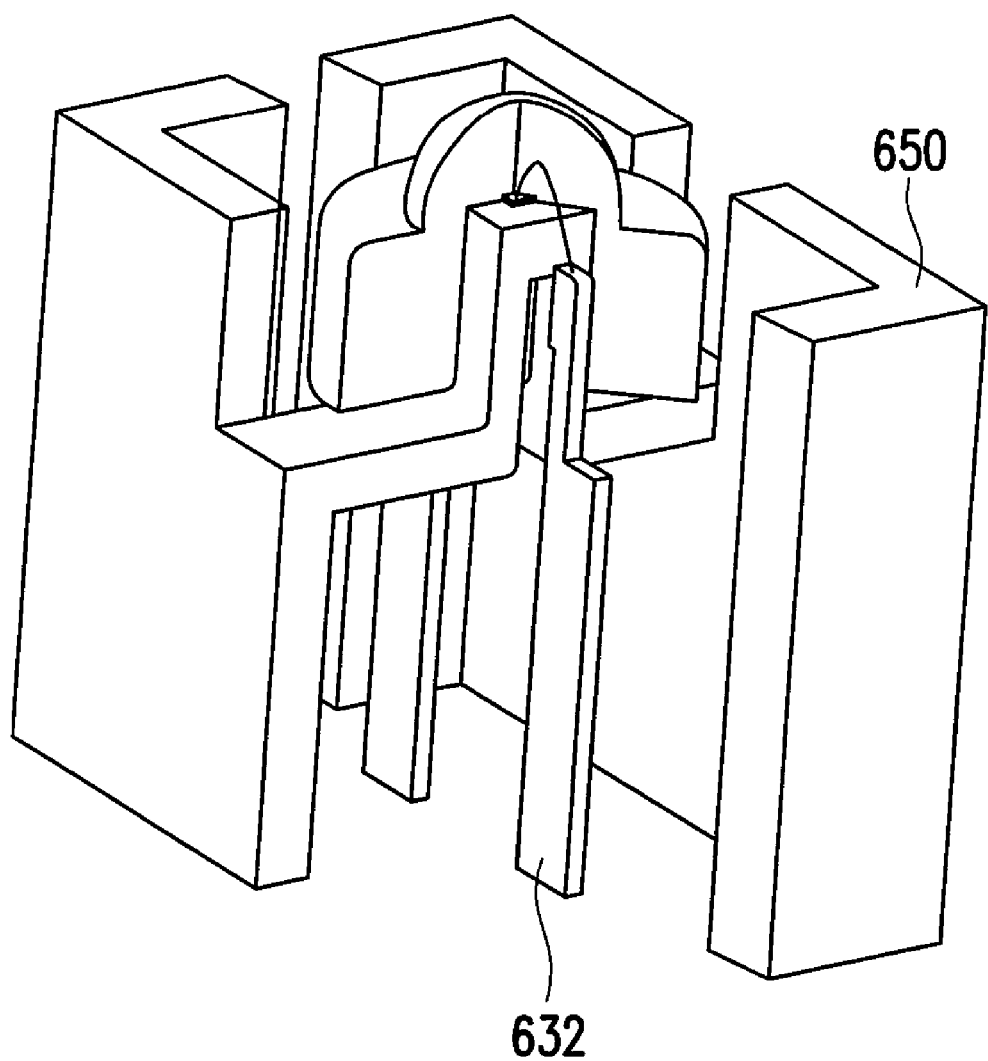
FIG. 9 is a perspective view illustrating an inverted U-shaped rectangular heat dissipation carrier in a heat dissipation package according to a sixth embodiment of the present invention.

FIG. 9 is a perspective view illustrating an inverted U-shaped rectangular heat dissipation carrier in a heat dissipation package according to a sixth embodiment of the present invention. According to FIG. 9, since the heat dissipation carrier of the present invention may have a rectangular profile, the inverted U-shaped rectangular heat dissipation carrier 650 is constructed. Correspondingly, the through hole of the heat dissipation base should be accordingly made in a quadrangular form (not shown in the drawings).

Figure 10:
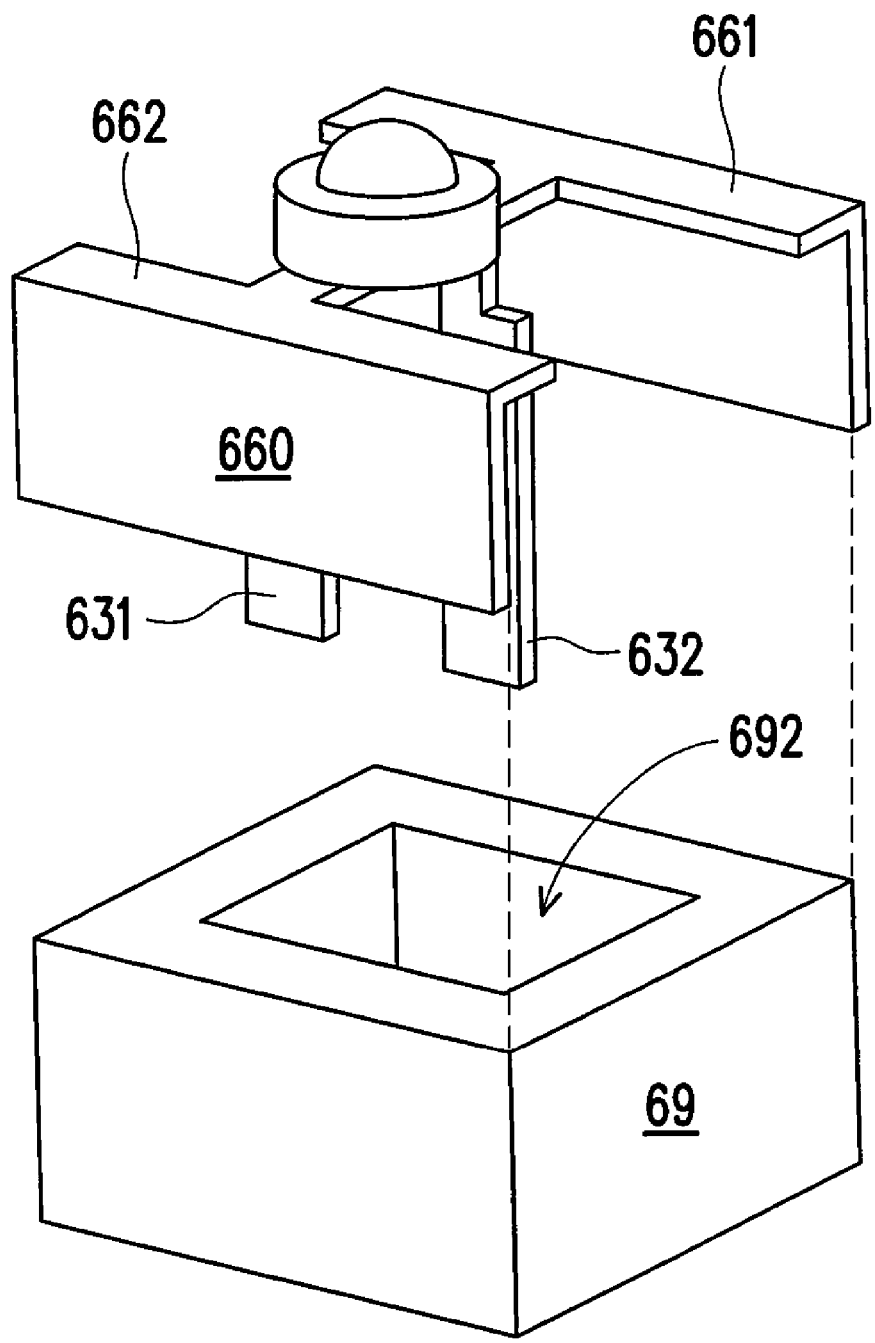
FIG. 10 depicts a cap heat dissipation carrier of a heat dissipation package assembled by being inserted into a heat generation element according to a seventh embodiment of the present invention.

FIG. 10 depicts a cap heat dissipation carrier of a heat dissipation package for a heat generation element according to a seventh embodiment of the present invention. According to FIG. 10, the heat dissipation carrier of the present invention may be a cap heat dissipation carrier 660 having L-shaped heat dissipation carriers 661 and 662 for covering the peripheries of the heat dissipation base 69. As disclosed in the previous embodiment, the central conducting leads 631 and 632 are located between the L-shaped heat dissipation carriers 661 and 662. As the light emitting device is wedged into the through hole 692 of the heat dissipation base 69, the central conducting leads 631 and 632 may be disposed in the through hole 692.

Figure 11:
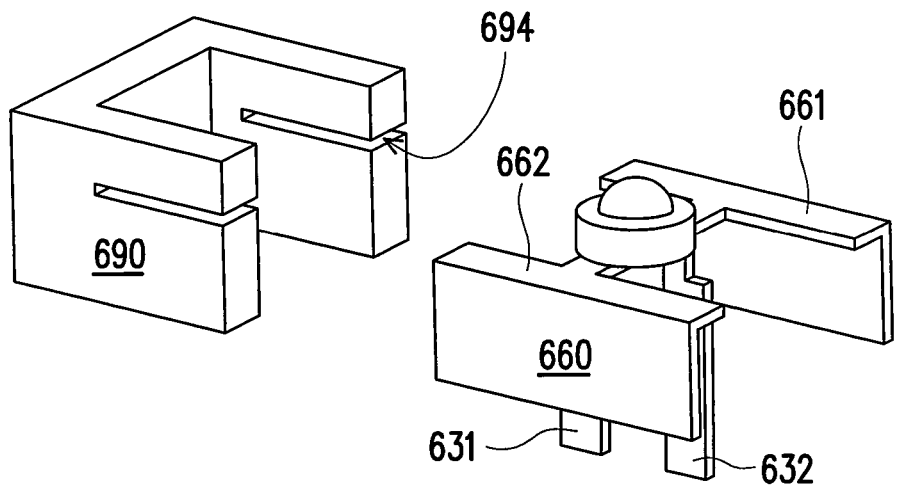
FIG. 11 depicts a sliding heat dissipation carrier of a heat dissipation package according to an eighth embodiment of the present invention.

FIG. 11 depicts a sliding heat dissipation carrier of a heat dissipation package assembled by being slid into a heat generation element according to an eighth embodiment of the present invention. In the present embodiment, an U-shaped heat dissipation base 690 having sliding grooves 694 at both arms of the U-shaped heat dissipation base 690, such that the L-shaped heat dissipation carriers 661 and 662 of the light emitting device can be slid into and mounted to the sliding groove 694. Other operational principles of heat dissipation are identical to those discussed above.

Figure 12:
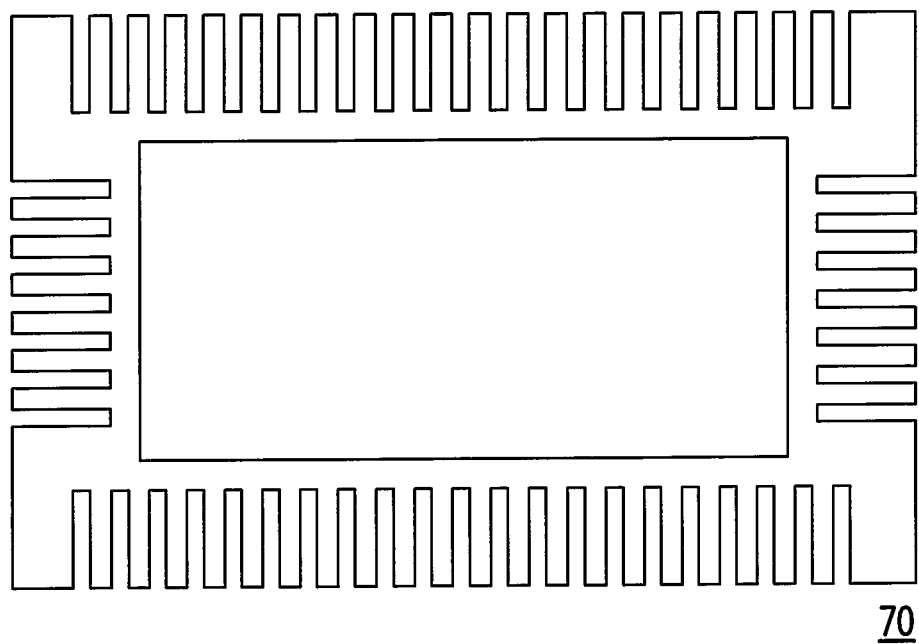
FIG. 12 is a top view of another heat dissipation base employed in the present invention.

The heat dissipation bases in a variety of geometric shapes are taken only as examples in the previous embodiments. Practically speaking, however, fin-shaped heat sinks may be located at the peripheries of the heat dissipation base 70, as shown in FIG. 12. Thereby, the efficiency of heat dissipation can be enhanced when the heat dissipation base 70 is actually applied. Furthermore, two conducting leads are taken as the examples to elaborate the previous embodiments, while the number of the conducting leads may vary based on actual demands.

Figure 13:
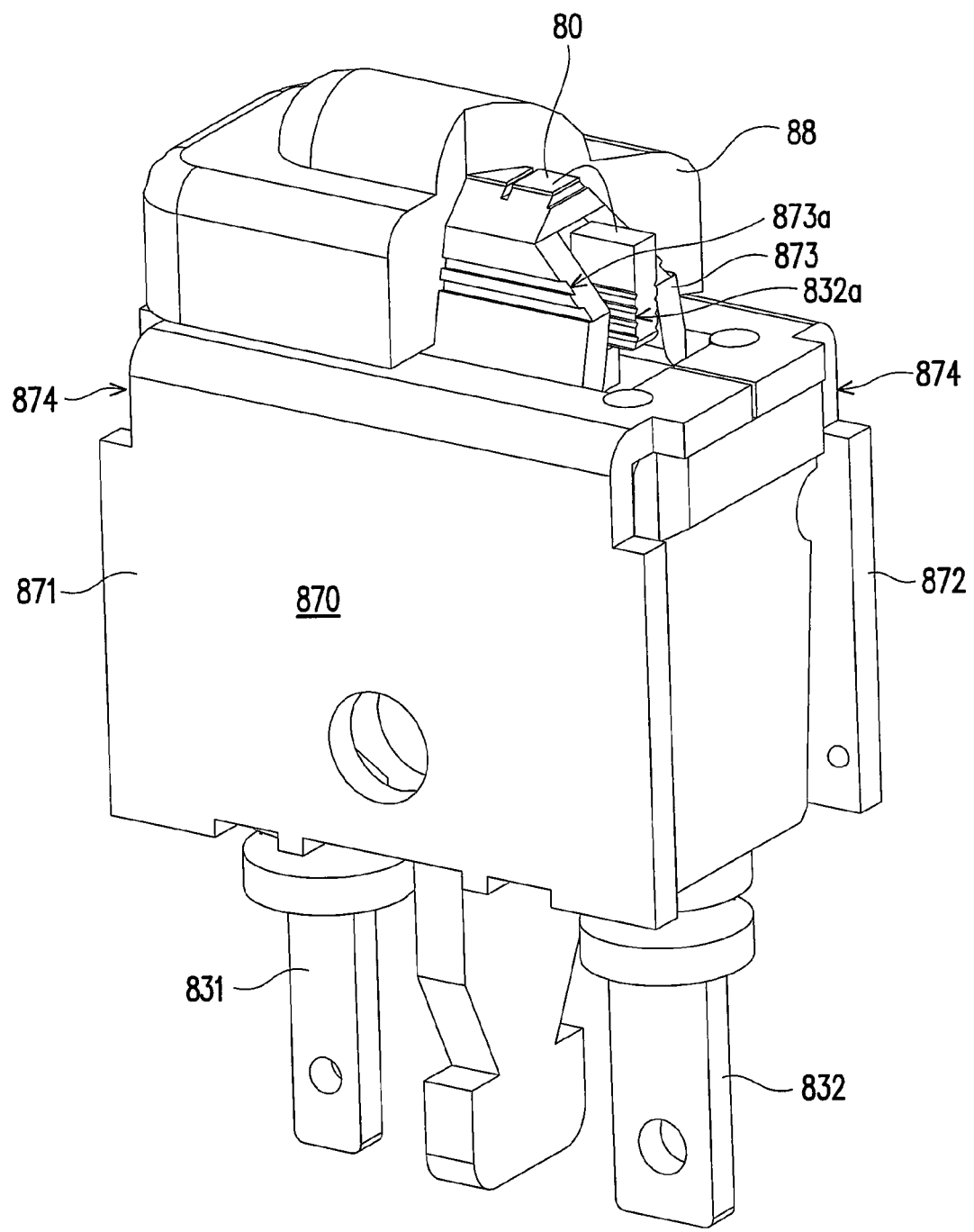
FIG. 13 is a perspective view illustrating a heat dissipation package according to a ninth embodiment of the present invention.

FIG. 13 is a perspective view illustrating a heat dissipation package according to a ninth embodiment of the present invention. According to FIG. 13, the heat dissipation carrier 870 is shaped substantially as a letter U and comprises a carrier part 873, a left dissipating part 871 and a right dissipating part 872. A heat generation element 80 such as an LED is mounted on the carrier part 873. The heat generation element 80, the carrier part 873 and the conducting leads 831 and 832 are secured by an encapsulating material 88. A surface of the carrier part 873 of the heat dissipation carrier 870 has at least one notch 873a thereon, and the notch 873a is filled with the encapsulating material 88. The notch 873a is used to enhance the binding force between the encapsulating material 88 and the heat dissipation carrier 870. Also, a surface of one or all of the conducting leads 831 and 832 has at least one notch 832a thereon, and the notch 832a is filled with the encapsulating material 88 for enhancing the binding force between the encapsulating material 88 and the conducting leads 831 and 832. Moreover, the portions of the conducting leads 831 and 832 away from the heat generation element 80 have different widths, so as to avoid the incorrect connection between the conducting leads 831 and 832 and a plug (not shown). Meanwhile, the heat dissipation carrier 870 has positioning indentations 874 for positioning the heat dissipation carrier 870 with a die (not shown) while forming the encapsulating material 88 or with a reflector (not shown) while assembling the reflector to the heat dissipation package.

Figure 14A:
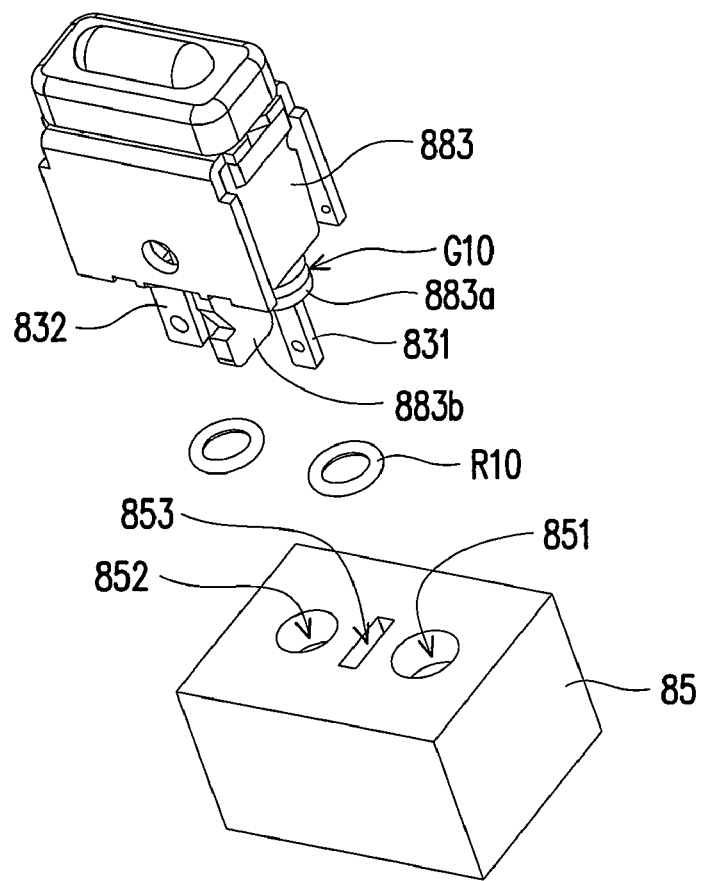
FIGS. 14A and 14B are schematic views illustrating the statuses before and after the heat dissipation package of FIG. 13 is connected with a plug.
Figure 14B:
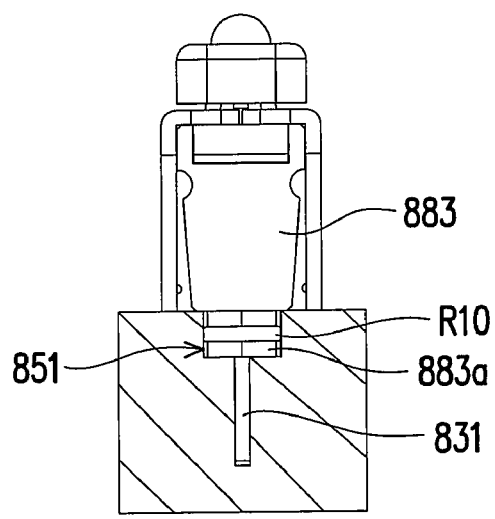

FIGS. 14A and 14B are schematic views illustrating the statuses before and after the heat dissipation package of FIG. 13 is connected with a plug, wherein the plug in FIG. 14B is only shown with a cross-section. According to FIGS. 14A and 14B, the conducting leads 831 and 832 can be plugged into two plug holes 851 and 852 of a plug 85. The heat dissipation carrier 870 and the conducting leads 831 and 832 are secured by an enhanced encapsulating material 883. The enhanced encapsulating material 883 has two tube-shaped portions 883a, portion of each of the conducting leads 831 and 832 in the plug holes 851 and 852 is encircled by one tube-shaped portion 883a. The outer surface of each of the tube-shaped portions 883a has a circular groove G10, and two waterproofing rings R10 are disposed in the circular grooves G10.

Figure 14C:
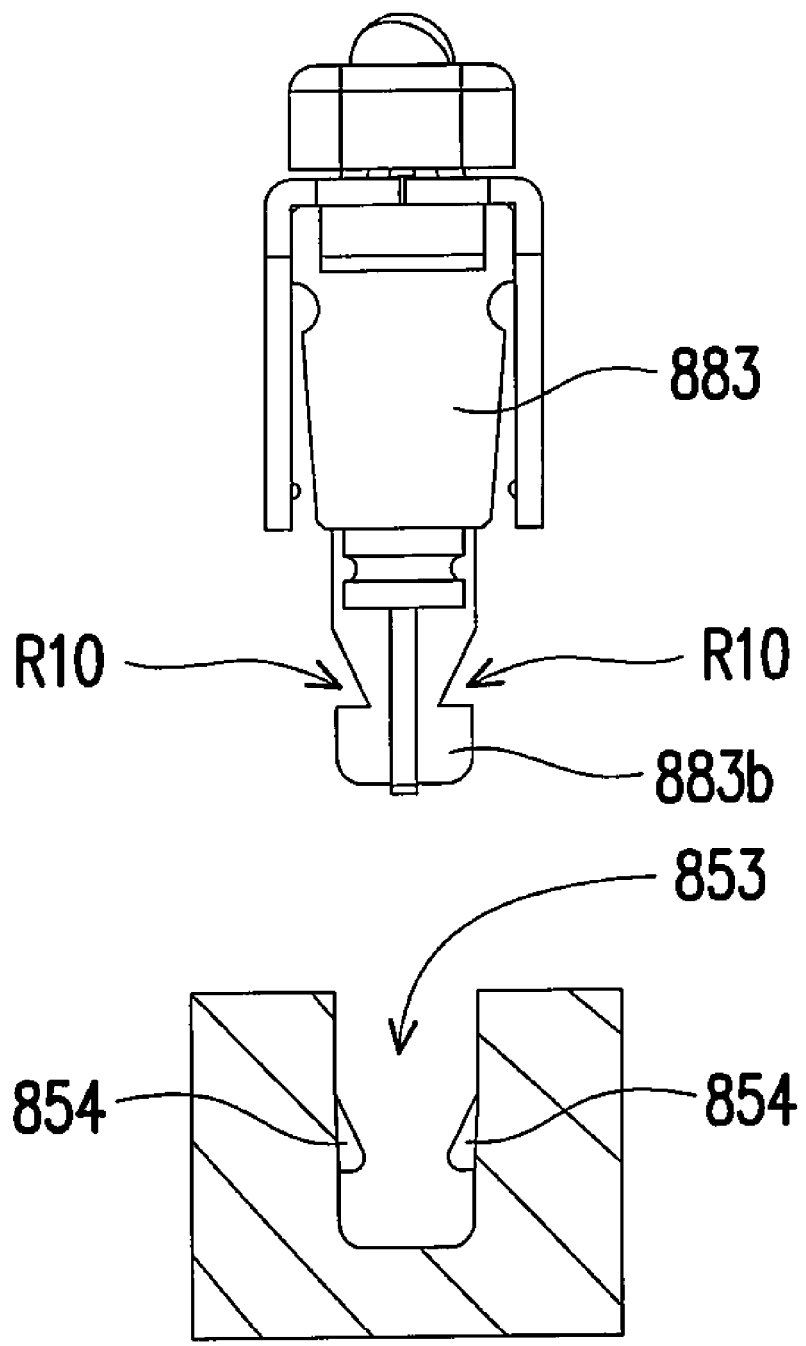
FIG. 14C is another schematic view illustrating the statuses before the heat dissipation package of FIG. 13 is connected with a plug.

FIG. 14C is another schematic view illustrating the statuses before the heat dissipation package of FIG. 13 is connected with a plug, wherein the plug in FIG. 14C is only shown with another cross-section different from the cross-section provided in FIG. 14B. According to FIGS. 14A and 14C, the enhanced encapsulating material 883 has a positioning pin 883b. The plug 85 has a positioning hole 853 and two springs 854 retractably disposed in the positioning hole 853. The positioning pin 883b has two recesses R10. The springs 854 are retracted once the positioning pin 883b contacts the springs 854 during the positioning pin 883b is wedging into the positioning hole 853. Thereafter, the springs 854 protrude into the positioning hole 853 and are wedged in the recesses RIO for wedging the positioning pin 883b in the positioning hole 853.

Figure 15A:
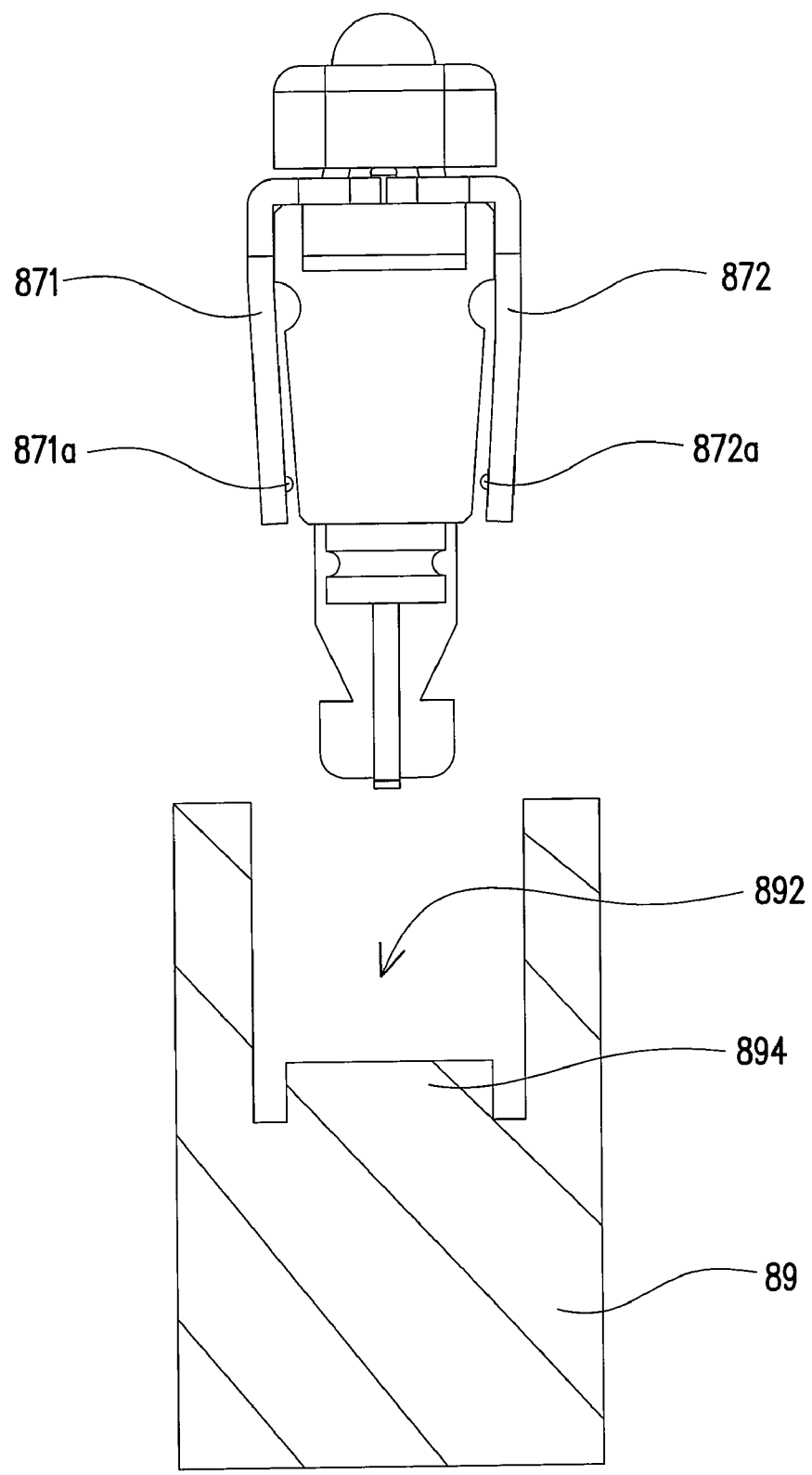
FIGS. 15A and 15B are schematic views illustrating the statuses before and after the heat dissipation package of FIG. 13 is connected with a heat dissipation base.
Figure 15B:
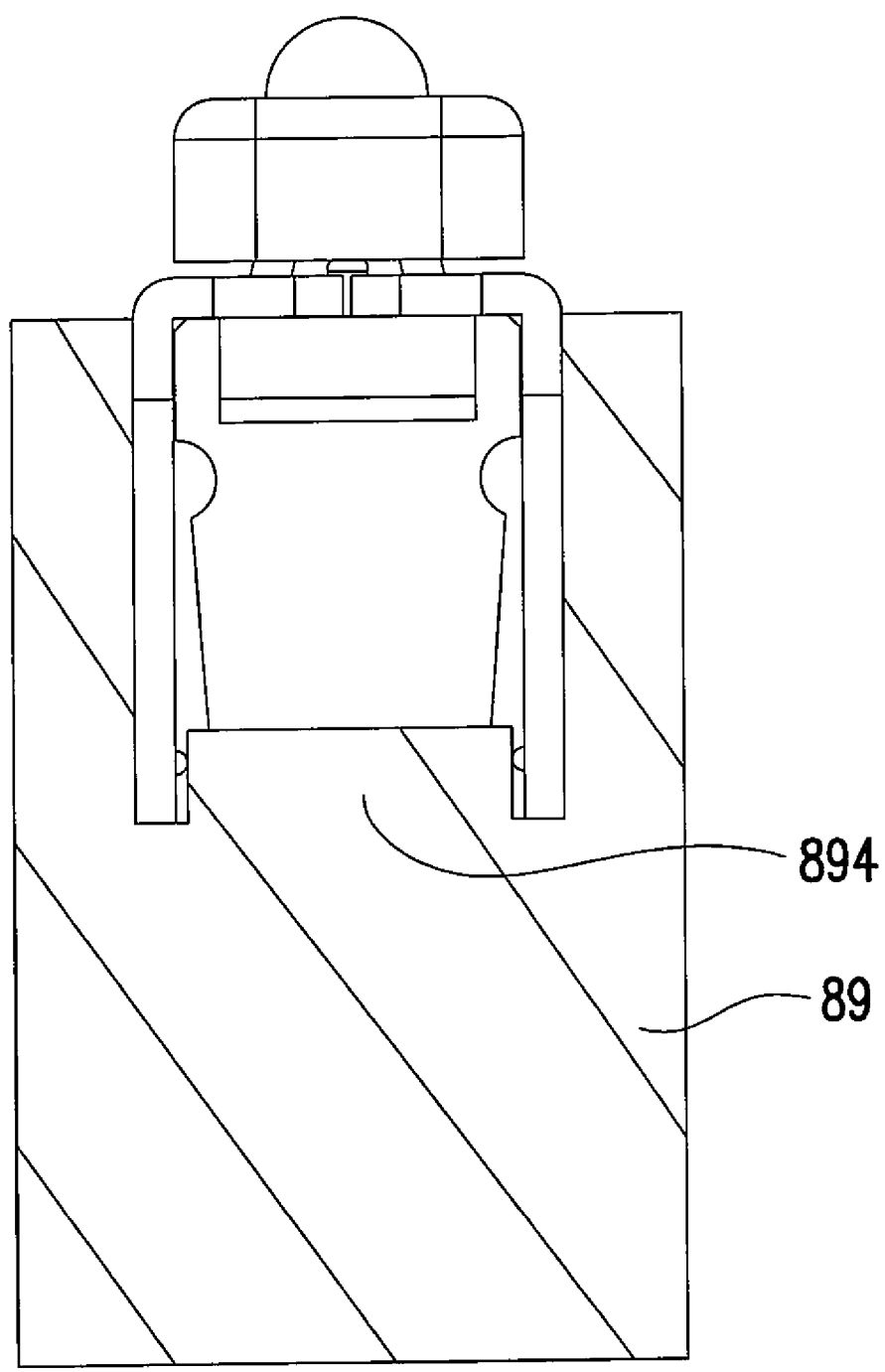

FIGS. 15A and 15B are schematic views illustrating the statuses before and after the heat dissipation package of FIG. 13 is connected with a heat dissipation base, wherein the heat dissipation base in FIG. 15B is only shown with a cross-section. According to FIGS. 15A and 15B, the surfaces facing to each other of the dissipating parts 871 and 872 have bumps 871a and 872a thereon. While the heat dissipation carrier 870 is inserted into a hole 892 of a heat dissipation base 89, the bumps 871a and 872a are pushed by a protruding portion 894 in the bottom of the hole 892, and the dissipating parts 871 and 872 are pushed outward tightly against the wall of the hole 892. Therefore, the heat transmitting efficiency between the heat dissipation carrier 870 and the heat dissipation base 89 is improved. Meanwhile, a power supplying function of conventional plug can be incorporated in the heat dissipation base 89.

To sum up, in the heat dissipation package for the heat generation element according to the present invention, there is no limitation caused by the electric elements surrounding the heat dissipation carrier, such that the lateral and the two-dimensional expandability of the heat dissipation carrier can be enhanced. As such, more heat dissipation bases can be installed based on different conditions, and the heat dissipation capacity can be effectively improved.

While the preferred embodiments have been described by way of examples, it will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A heat dissipation package, comprising:
a heat generation element having at least two electrodes;
a heat dissipation carrier having at least two dissipating parts and a carrier part, wherein the carrier part connects the at least two dissipating parts, and the heat generation element is disposed on the carrier part; and
conducting leads shaped to be adaptable to plug holes of a plug, electrically coupled to the electrodes of the heat generation element, located between the at least two dissipating parts of the heat dissipation carrier, and electrically insulated from the heat dissipation carrier.

2. The heat dissipation package for the heat generation element as claimed in claim 1, further comprising a heat dissipation base for mounting the heat dissipation carrier therein and the heat dissipation base having a through hole for housing the conducting leads.

3. The heat dissipation package for the heat generation element as claimed in claim 2, further comprising fin-shaped heat sinks located at peripheries of the heat dissipation base.

4. The heat dissipation package for the heat generation element as claimed in claim 2, wherein the plug is disposed in the through hole of the heat dissipation base and electrically coupled to the conducting leads.

5. The heat dissipation package for the heat generation element as claimed in claim 2, wherein the heat dissipation base is shaped as a rectangle.

6. The heat dissipation package for the heat generation element as claimed in claim 2, wherein the heat dissipation base is shaped as a letter U.

7. The heat dissipation package for the heat generation element as claimed in claim 6, wherein the U-shaped heat dissipation base further comprises sliding grooves located at respective arms of the U-shaped heat dissipation base for sliding and mounting the heat dissipation carrier.

8. The heat dissipation package for the heat generation element as claimed in claim 1, wherein the heat generation element is a semiconductor chip.

9. The heat dissipation package for the heat generation element as claimed in claim 1, wherein the heat generation element is a light emitting diode (LED).

10. The heat dissipation package for the heat generation element as claimed in claim 9, further comprising a lens located at a light emitting end of the LED, so as to modify the light emitted from the light emitting end of the LED.

11. The heat dissipation package for the heat generation element as claimed in claim 1, wherein a section of the heat dissipation carrier is substantially shaped as an inverted letter U, or a letter M, or a letter W.

12. The heat dissipation package for the heat generation element as claimed in claim 1, further comprising an encapsulating material for packaging and protecting the heat generation element, the heat dissipation carrier and the conducting leads.

13. The heat dissipation package for the heat generation element as claimed in claim 12, wherein the encapsulating material is transparent.

14. The heat dissipation package for the heat generation element as claimed in claim 12, wherein a surface of the heat dissipation carrier has at least one notch thereon, and the notch is filled with the encapsulating material.

15. The heat dissipation package for the heat generation element as claimed in claim 12, wherein a surface of one of the conducting leads has at least one notch thereon, and the notch is filled with the encapsulating material.

16. The heat dissipation package for the heat generation element as claimed in claim 1, further comprising an enhanced encapsulating material for securing the heat dissipation carrier and the conducting leads.

17. The heat dissipation package for the heat generation element as claimed in claim 16, wherein the enhanced encapsulating material is opaque.

18. The heat dissipation package for the heat generation element as claimed in claim 16, wherein the enhanced encapsulating material is transparent.

19. The heat dissipation package for the heat generation element as claimed in claim 16, wherein portion of each of the conducting leads in the plug holes is encircled by a tube-shaped portion of the enhanced encapsulating material, the outer surface of each of the tube-shaped portions has a circular groove, and each of the circular grooves is suitable for a waterproofing ring to be disposed therein.

20. The heat dissipation package for the heat generation element as claimed in claim 16, wherein the enhanced encapsulating material has a positioning pin suitable to be wedged in a positioning hole of the plug, the positioning pin has at least one recess, and a spring inside the positioning hole is wedged in the recess while the positioning pin is wedged in the positioning hole.

21. The heat dissipation package for the heat generation element as claimed in claim 1, wherein the heat dissipation carrier has at least one positioning indentation.

22. The heat dissipation package for the heat generation element as claimed in claim 1, wherein the heat dissipation carrier is shaped as a letter U, and the surfaces facing to each other of the at least two dissipating parts have bumps thereon.

23. The heat dissipation package for the heat generation element as claimed in claim 1, wherein the plug is electrically coupled to the conducting leads.

24. The heat dissipation package for the heat generation element as claimed in claim 1, wherein the portions of the conducting leads away from the heat generation element have different widths.

* * * * *